US010181479B2

(12) United States Patent
Tan

(10) Patent No.: US 10,181,479 B2
(45) Date of Patent: Jan. 15, 2019

(54) ARRAY SUBSTRATE AND MANUFACTURING METHOD THEREOF

(71) Applicant: Shenzhen China Star Optoelectronics Technology Co., Ltd., Shenzhen (CN)

(72) Inventor: Zhiwei Tan, Shenzhen (CN)

(73) Assignee: SHENZHEN CHINA STAR OPTOELECTRONICS SEMICONDUCTOR DISPLAY TECHNOLOGY CO., LTD., Shenzhen, Guangdong (CN)

( * ) Notice: Subject to any disclaimer, the term of this patent is extended or adjusted under 35 U.S.C. 154(b) by 43 days.

(21) Appl. No.: 15/529,508

(22) PCT Filed: Apr. 14, 2017

(86) PCT No.: PCT/CN2017/080507
§ 371 (c)(1),
(2) Date: May 25, 2017

(87) PCT Pub. No.: WO2018/170971
PCT Pub. Date: Sep. 27, 2018

(65) Prior Publication Data
US 2018/0308868 A1   Oct. 25, 2018

(30) Foreign Application Priority Data

Mar. 22, 2017 (CN) .......................... 2017 1 0175245

(51) Int. Cl.
*H01L 27/14* (2006.01)
*H01L 27/12* (2006.01)
(Continued)

(52) U.S. Cl.
CPC ........ *H01L 27/1222* (2013.01); *G02F 1/1368* (2013.01); *G02F 1/133512* (2013.01);
(Continued)

(58) Field of Classification Search
CPC ............ H01L 27/1262; H01L 27/1288; G02F 1/133512
(Continued)

(56) References Cited

U.S. PATENT DOCUMENTS 7,385,651 B2   6/2008  Nam et al.
9,443,881 B2 *  9/2016  Song ....................... H01L 27/12

FOREIGN PATENT DOCUMENTS

CN        1508614 A    6/2004
CN        1905166 A    1/2007
CN      102799014 A   11/2012

* cited by examiner

*Primary Examiner* — Tan N Tran
(74) *Attorney, Agent, or Firm* — Leong C. Lei

(57) ABSTRACT

The present invention provides a manufacturing method of an array substrate and an array substrate. The manufacturing method of the array substrate according to the present invention combines the COA technology and the BOA technology, where a black matrix is first formed on a backing plate, followed by forming a top-gate TFT device on the black matrix, and finally forming a color filter layer on the TFT device, wherein the pixel electrode is directly arranged on the drain electrode and connected with the drain electrode. The manufacturing method helps enhance electrical performance of a TFT device and stability of performance, improves quality of a display panel, and, compared to an existing array substrate manufacturing method, reduces masks and operations involved. The manufacturing method is simple and helps reduce manufacturing costs. The array substrate of the present invention requires a simple manufacturing method, provides enhanced electrical performance of a TFT device and stability of performance, and improves quality of a display panel.

13 Claims, 7 Drawing Sheets

(51) Int. Cl.
 *G02F 1/1368* (2006.01)
 *G02F 1/1335* (2006.01)
(52) U.S. Cl.
 CPC .... *G02F 1/133514* (2013.01); *H01L 27/1262* (2013.01); *H01L 27/1288* (2013.01); *G02F 2201/123* (2013.01)
(58) Field of Classification Search
 USPC .......................................... 257/59, 72, 432
 See application file for complete search history.

ARRAY SUBSTRATE AND MANUFACTURING METHOD THEREOF

BACKGROUND OF THE INVENTION

1. Field of the Invention

The present invention relates to the field of display technology, and more particular to an array substrate and a manufacturing method thereof.

2. The Related Arts

In the field of display technology, active matrix liquid crystal displays (AMLCDs) are one of the most commonly used flat panel displays. A liquid crystal panel is a core constituent part of the AMLCDs. A conventional liquid crystal panel is generally made up of a color filter (CF) substrate, a thin film transistor (TFT) array substrate, and a liquid crystal layer arranged between the two substrates, of which an operation principle is that with liquid crystal molecules disposed between the two parallel glass substrate, a plurality of vertical and horizontal tiny electrical wires that are arranged between the two glass substrates are applicable with electricity to control the liquid crystal molecules to change direction so as to refract out light from a backlight module to generate an image. In this arrangement, the TFT array substrate is formed with a TFT array for driving the liquid crystal to rotate and thus controlling displaying of each pixel.

There are numerous structures of thin-film transistors. AMLCDs of a current main stream adopt a bottom-gate TFT array substrate structure. As shown in FIG. 1, a schematic view is provided to illustrate a structure of a conventional bottom-gate TFT array substrate. The bottom-gate TFT array substrate comprises a glass substrate 100, a gate electrode 200 arranged on the glass substrate 100, a gate insulation layer (GI) 300 arranged on the gate electrode 200 and the glass substrate 100, an active layer 400 arranged on the gate insulation layer 300, a source electrode 510 and a drain electrode 520 arranged on the active layer 400 and the gate insulation layer 300 and spaced from each other, a passivation layer (PV) 600 arranged on the source electrode 510, the drain electrode 520, the active layer 400, and the gate insulation layer 300. A manufacturing method of the bottom-gate TFT array substrate comprises:

Step 101: providing a glass substrate 100, depositing a first metal layer (M1) on the glass substrate 100, subjecting the first metal layer to patterning to form a gate electrode 200; forming a gate insulation layer 300 on the gate electrode 200 and the glass substrate 100 through deposition;

Step 102: sequentially depositing a non-doped amorphous silicon layer (a-Si) and a boron ion-doped amorphous silicon layer on the gate insulation layer 300, using a high-end mask, such as a gray tone mask or a half tone mask to subject the non-doped amorphous silicon layer and the boron ion-doped amorphous silicon layer to patterning to form an active layer 400, wherein the boron ion-doped amorphous silicon layer, after patterning, forms N-type ohmic contact layers 410 of the active layer 400;

Step 103: depositing a second metal layer (M2) on the active layer 400 and the gate insulation layer 300 and subjecting the second metal layer to patterning to form a source electrode 510 and a drain electrode 520; and Step 104: forming a passivation layer 600 on the source electrode 510, the drain electrode 520, the active layer 400, and the gate insulation layer 300 through deposition.

Further, in the manufacturing process of the bottom-gate TFT array substrate, after forming the passivation layer 600, to achieve connection between the drain electrode 520 and a pixel electrode, it also need to form a via in the passivation layer 600 to be located above and corresponding to the drain electrode 520.

The reasons that the AMLCDs of the current main stream adopt the bottom-gate TFT array substrate are as follows. On the one hand, the gate electrode 200 of the bottom-gate TFT can function as a light shielding layer to shield light from a backlight module from irradiating the active layer 400 so as to prevent a photo current from generating and affecting stability of the device; and, on the other hand, film deposition order of the gate insulation layer 300/the amorphous silicon layer/the boron ion-doped amorphous silicon layer is perfectly reasonable so that interfacial influence is minimized and etching can be conducted easily.

However, during the process of forming a via, via abnormality or poor connection with a pixel electrode may be readily caused by factors including contaminant particles so as to reduce product yield. Further, in the main-stream AMLCDs, a black matrix (BM) and a color filter layer are often made on a CF substrate and this complicates the manufacturing of the CF substrate and makes it necessary to widen the black matrix in consideration of position shift occurring in laminating the CF substrate and the TFT array substrate so that aperture ratio of products is reduced.

COA (Color Filter on Array) technology is a technique that allows the color filter layer, namely color resists of red, green, and blue colors, to be directly formed on the array substrate, and BOA (Black Matrix on Array) technology is a technique that allows the black matrix to be directly formed on the array substrate. In a COA display panel, since the color resists of red, green, and blue colors are formed on the TFT array substrate, there is no issue concerning alignment between the color filter substrate and the array substrate so as to reduce the difficulty of a boxing process in making a display panel and avoiding boxing errors. However, in a conventional COA array substrate, the color filter layer is arranged between the TFT device and the pixel electrode so that it is necessary to form an opening in the color filter layer for achieving interlayer connection. This readily causes bubbles generated in a subsequent process.

SUMMARY OF THE INVENTION

Objectives of the present invention are to provide a manufacturing method of an array substrate, which helps enhance electrical performance of a thin-film transistor (TFT) device and stability of performance, improves quality of a display panel, and reduces masks and operation involved so as to provide a simple manufacturing method and reduce a manufacturing cost.

Objectives of the present invention are also to provide an array substrate, which requires a simple manufacturing method, provides enhanced electrical performance of a TFT device and stability of performance, and improves quality of a display panel.

To achieve the above objectives, the present invention provides a manufacturing method of an array substrate, which comprises the following steps:

Step S1: providing a backing plate, coating a layer of a black resist material on the backing plate, followed by exposure and development to form a black matrix; and then, forming an isolation layer on the black matrix and the backing plate through deposition;

Step S2: sequentially depositing a second metal layer and an ion-doped amorphous silicon layer on the isolation layer, subjecting the second metal layer and the ion-doped amorphous silicon layer to patterning, so as to form spaced source electrode and drain electrode from the second metal layer and form ohmic contact layers that are respectively located on the source electrode and the drain electrode from the ion-doped amorphous silicon layer, wherein the ohmic contact layers have sizes that are smaller than sizes of the source electrode and the drain electrode so as to expose a portion of an upper surface of the drain electrode;

Step S3: depositing a transparent conductive film on the backing plate obtained in Step S2 and subjecting the transparent conductive film to patterning to form a pixel electrode, wherein the pixel electrode is located on the drain electrode and the isolation layer to be connected with a portion of the drain electrode that is exposed outside the ohmic contact layer;

Step S4: depositing an amorphous silicon layer on the backing plate obtained in Step S3 and subjecting the amorphous silicon layer to patterning to form a semiconductor layer, wherein the semiconductor layer is located on the ohmic contact layers and the isolation layer and constitutes, in combination with the ohmic contact layers, an active layer;

Step S5: sequentially depositing a gate insulation layer and a first metal layer on the backing plate obtained in Step S4 and subjecting the first metal layer to patterning to form a gate electrode located above and corresponding to the active layer;

Step S6: depositing a passivation layer on the gate insulation layer and the gate electrode; and Step S7: forming a color filter film layer on the passivation layer.

In Step S2, patterning of the second metal layer and the ion-doped amorphous silicon layer is conducted with one mask and comprises the following process: coating a photoresist material on the ion-doped amorphous silicon layer, using the mask to subject the photoresist material to exposure and development to form a photoresist layer, using the photoresist layer as a shielding layer to first subject the ion-doped amorphous silicon layer to dry etching to form the ohmic contact layers, and then, subject the second metal layer to wet etching to form the source electrode and the drain electrode.

The ion-doped amorphous silicon layer and the amorphous silicon layer are made by chemical vapor deposition; and a difference of manufacturing operations of the ion-doped amorphous silicon layer and the amorphous silicon layer is that borane gas is introduced in the chemical vapor deposition in which the ion-doped amorphous silicon layer is deposited.

The isolation layer, the gate insulation layer, and the passivation layer are made by chemical vapor deposition; and the isolation layer, the gate insulation layer, and the passivation layer are each a silicon nitride layer, a silicon oxide layer, or a stacked combination of a silicon nitride layer and a silicon oxygen layer.

The second metal layer and the first metal layer are made by physical vapor deposition; and the second metal layer and the first metal layer are each formed of a material comprising one or multiple ones of molybdenum, aluminum, copper, and titanium.

The present invention also provides an array substrate, which comprises a backing plate, a black matrix arranged on the backing plate, an isolation layer arranged on the black matrix and the backing plate, a source electrode and a drain electrode arranged on the isolation layer and spaced from each other, ohmic contact layers arranged on the source electrode and the drain electrode, a pixel electrode arranged on the drain electrode and the isolation layer, a semiconductor layer arranged on the ohmic contact layers and the isolation layer, a gate insulation layer arranged on the pixel electrode, the semiconductor layer, and the isolation layer, a gate electrode arranged on the gate insulation layer, a passivation layer arranged on the gate insulation layer and the gate electrode, and a color filter film layer arranged on the passivation layer;

wherein the ohmic contact layers have sizes that are smaller than sizes of the source electrode and the drain electrode so as to expose a portion of an upper surface of the drain electrode; the pixel electrode is connected to a portion of the ohmic contact layer exposed outside the drain electrode; the semiconductor layer and the ohmic contact layers are formed of an amorphous silicon material layer and an ion-doped amorphous silicon material layer, respectively, and the semiconductor layer and the ohmic contact layers collectively form an active layer.

The ohmic contact layers and the source and drain electrodes are formed through patterning conducted with one mask, wherein the ohmic contact layers are formed through dry etching, and the source electrode and the drain electrode are formed through wet etching.

The ohmic contact layers and the semiconductor layer are made by chemical vapor deposition; and a difference of manufacturing operations of the ohmic contact layers and the semiconductor layer is that borane gas is introduced in the chemical vapor deposition process in which the ohmic contact layers are made.

The isolation layer, the gate insulation layer, and the passivation layer are made by chemical vapor deposition; and the isolation layer, the gate insulation layer, and the passivation layer are each a silicon nitride layer, a silicon oxide layer, or a stacked combination of a silicon nitride layer and a silicon oxygen layer.

The source electrode, the drain electrode, and the gate electrode are made by physical vapor deposition; and the source electrode, the drain electrode, and the gate electrode are each formed of a material comprising one or multiple ones of molybdenum, aluminum, copper, and titanium.

The present invention further provides an array substrate, which comprises a backing plate, a black matrix arranged on the backing plate, an isolation layer arranged on the black matrix and the backing plate, a source electrode and a drain electrode arranged on the isolation layer and spaced from each other, ohmic contact layers arranged on the source electrode and the drain electrode, a pixel electrode arranged on the drain electrode and the isolation layer, a semiconductor layer arranged on the ohmic contact layers and the isolation layer, a gate insulation layer arranged on the pixel electrode, the semiconductor layer, and the isolation layer, a gate electrode arranged on the gate insulation layer, a passivation layer arranged on the gate insulation layer and the gate electrode, and a color filter film layer arranged on the passivation layer;

wherein the ohmic contact layers have sizes that are smaller than sizes of the source electrode and the drain electrode so as to expose a portion of an upper surface of the drain electrode; the pixel electrode is connected to a portion of the ohmic contact layer exposed outside the drain electrode; the semiconductor layer and the ohmic contact layers are formed of an amorphous silicon material layer and an ion-doped amorphous silicon material layer, respectively, and the semiconductor layer and the ohmic contact layers collectively form an active layer;

wherein the isolation layer, the gate insulation layer, and the passivation layer are made by chemical vapor deposition; and the isolation layer, the gate insulation layer, and the passivation layer are each a silicon nitride layer, a silicon oxide layer, or a stacked combination of a silicon nitride layer and a silicon oxygen layer; and wherein the source electrode, the drain electrode, and the gate electrode are made by physical vapor deposition; and the source electrode, the drain electrode, and the gate electrode are each formed of a material comprising one or multiple ones of molybdenum, aluminum, copper, and titanium.

The efficacy of the present invention is that the present invention provides a manufacturing method of an array substrate, which first forms a black matrix on a backing plate, followed by making a top-gate TFT device on the black matrix, and finally making a color filter layer on the TFT device, wherein the pixel electrode is directly arranged on a drain electrode and connected with the drain electrode so that connection can be achieved without the need to form a via in insulation layers. This also saves an opening formed in a color filter layer so as to effectively reduce occurrence of bubbles formed in a COA array substrate. Further, a black matrix may function as a light shielding layer to prevent irradiation of light from a backlight module of a display panel on an active layer to thereby improve stability of a device. Further, the color filter layer that is located on the topmost layer may provide planarization of an entire surface of the array substrate to facilitate control of cell gap of the display panel and prevent occurrence of random orientation of liquid crystal thereby helping improve quality of a display panel. Further, an ohmic contact layer that constitutes the active layer is formed through patterning with the same mask as that of the source electrode and the drain electrode, while a semiconductor layer is formed through patterning with another mask so that there is no need to use a high-end mask to make a channel zone of the active layer so as to allow the manufacturing of the active layer to be done with a regular mask based operation, achieving effects of shortening of production cycle and reducing costs. Further, there is also no concern about thickening the semiconductor layer due to applying etching to form the channel zone so that a thinned semiconductor layer can be made thereby improving electrical performance of a TFT device. The present invention provides an array substrate, which requires a simple manufacturing method, provides enhanced electrical performance of a TFT device and stability of performance, and improves quality of a display panel.

BRIEF DESCRIPTION OF THE DRAWINGS

The technical solution, as well as other beneficial advantages, of the present invention will become apparent from the following detailed description of embodiments of the present invention, with reference to the attached drawings.

In the drawings.

DETAILED DESCRIPTION OF THE PREFERRED EMBODIMENTS

To further expound the technical solution adopted in the present invention and the advantages thereof, a detailed description will be given with reference to the preferred embodiments of the present invention and the drawings thereof.

Figure 1:
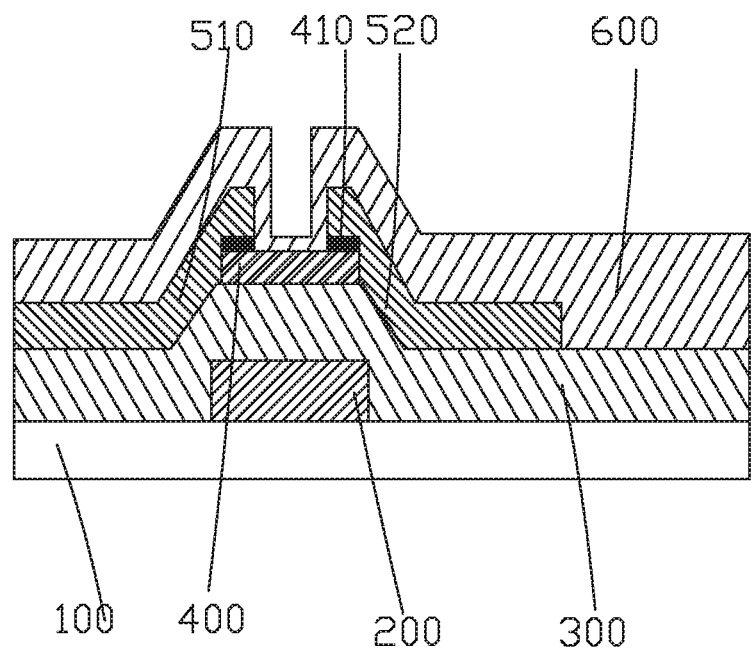
FIG. 1 is a schematic view illustrating a structure of a conventional bottom-gate thin-film transistor (TFT) array substrate.
Figure 2:
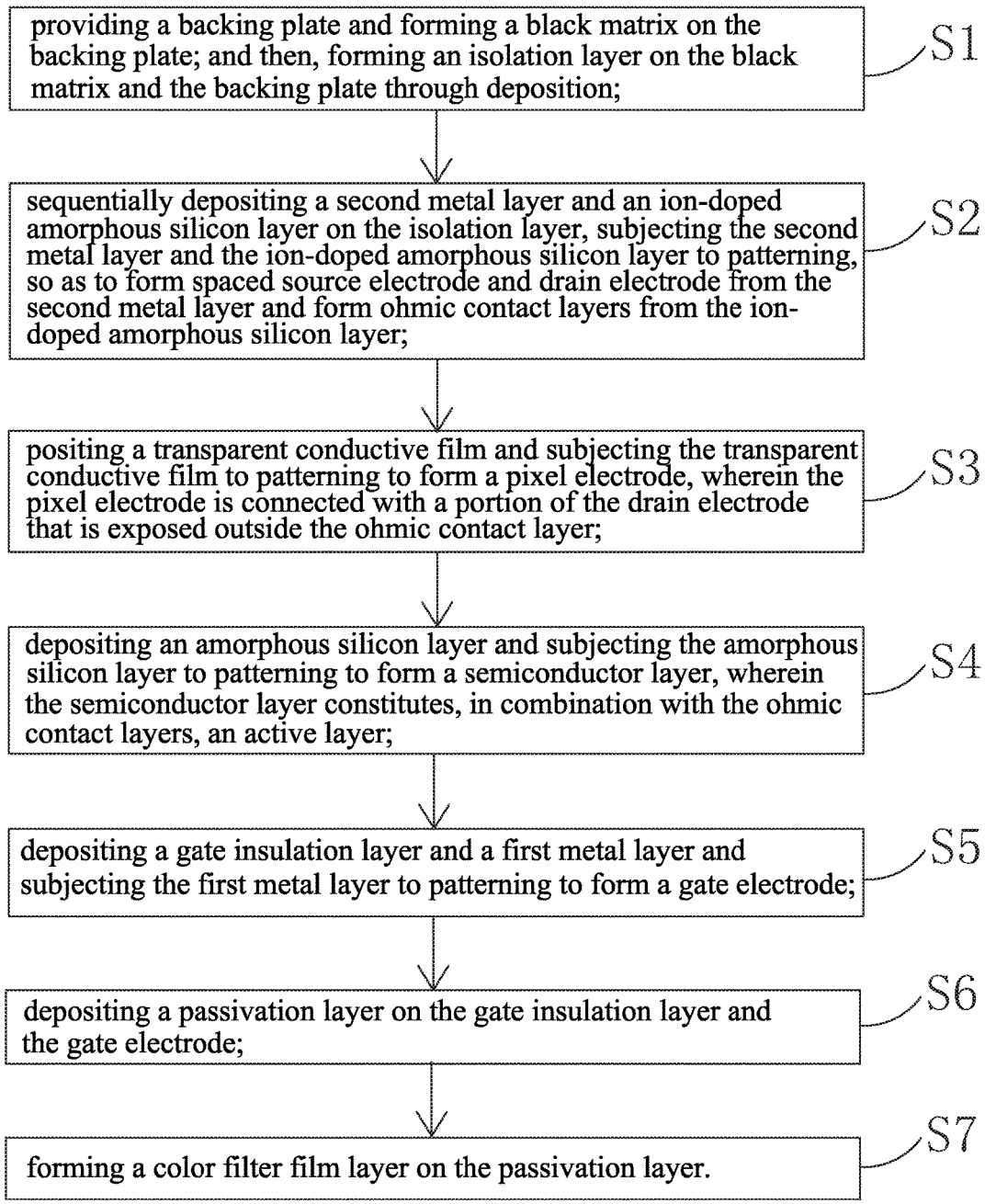
FIG. 2 is a flow chart illustrating a manufacturing method of an array substrate according to the present invention.
Figure 3:
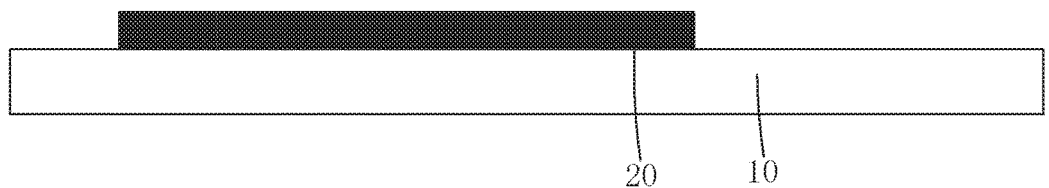
FIGS. 3-4 are schematic views illustrating Step S1 of the manufacturing method of the array substrate according to the present invention.
Figure 4:
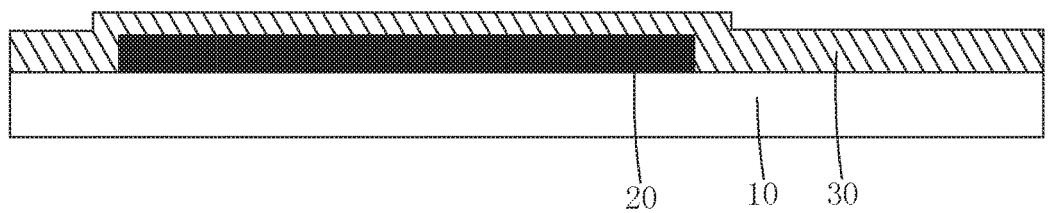

Referring to FIG. 2, the present invention provides a manufacturing method of an array substrate, comprising the following steps:

Step S1: as shown in FIGS. 3-4, providing a backing plate 10, coating a layer of a black resist material on the backing plate 10, followed by exposure and development to form a black matrix 20; and then, forming an isolation layer 30 on the black matrix 20 and the backing plate 10 through deposition.

Specifically, the isolation layer 30 functions to isolate and prevent the resist material of the black matrix 20 from contaminating a TFT device that is subsequently formed, and it is noted that the black matrix 20 comprises a resist material, so that it is desired to adopt a low-temperature process in a subsequent process in order to prevent a side effect caused by poor thermal stability of the resist.

Specifically, the isolation layer 30 is made by chemical vapor deposition (CVD); and the isolation layer 30 comprises a silicon nitride (SiNx) layer, a silicon oxide (SiO$_2$) layer, or a stacked combination of a silicon nitride layer and a silicon oxygen layer, and a silicon nitride layer is preferred in this embodiment.

Figure 5:
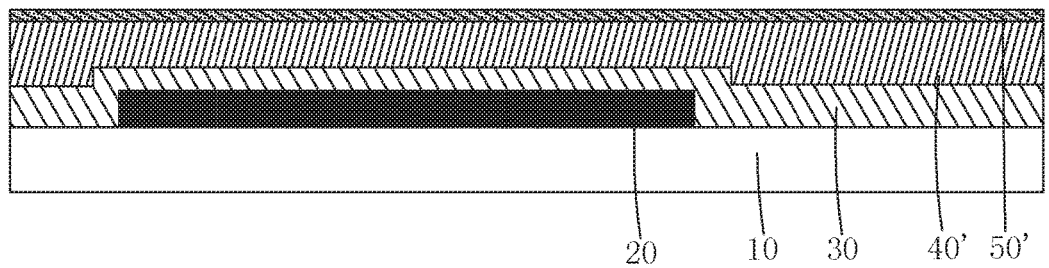
FIGS. 5-6 are schematic views illustrating Step S2 of the manufacturing method of the array substrate according to the present invention.
Figure 6:
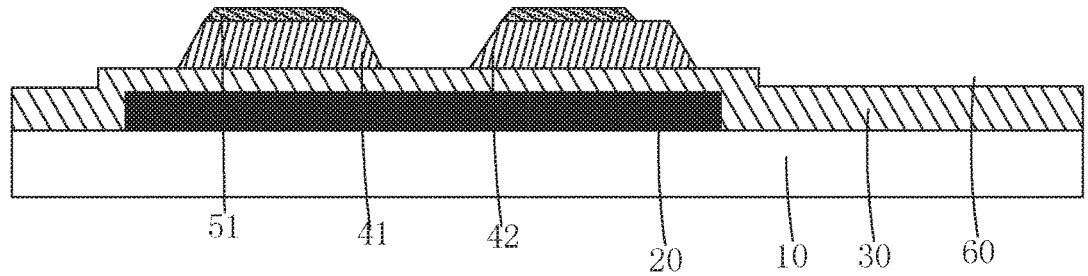

Step S2: as shown in FIGS. 5-6, sequentially depositing a second metal layer 40' and an ion-doped amorphous silicon layer 51' on the isolation layer 30, subjecting the second metal layer 40' and the ion-doped amorphous silicon layer 51' to patterning, so as to form spaced source electrode 41 and drain electrode 42 from the second metal layer 40' and form ohmic contact layers 51 that are respectively located on the source electrode 41 and the drain electrode 42 from the ion-doped amorphous silicon layer 51', wherein the ohmic contact layers 51 have sizes that are smaller than sizes of the source electrode 41 and the drain electrode 42 so as to expose a portion of an upper surface of the drain electrode 42.

Specifically, the second metal layer 40' is made by physical vapor deposition (PVD); and the second metal layer 40' is formed of a material comprising one or multiple ones of molybdenum (Mo), aluminum (Al), copper (Cu), and titanium (Ti).

Specifically, in Step 2, patterning of the second metal layer 40' and the ion-doped amorphous silicon layer 51' is conducted with one mask, and specifically comprises the following process: coating a photoresist material on the ion-doped amorphous silicon layer 51', using the mask to subject the photoresist material to exposure and development to form a photoresist layer, using the photoresist layer as a shielding layer to first subject the ion-doped amorphous silicon layer 51' to dry etching to form the ohmic contact layers 51, and then, subject the second metal layer 40' to wet etching to form the source electrode 41 and the drain electrode 42, wherein since dry etching achieves a greater extent of lateral etching than wet etching, the ohmic contact layers 51 formed through dry etching would be of sizes that are smaller than those of the source electrode 41 and the drain electrode 42 formed through wet etching so as to expose a portion of the upper surface of the drain electrode 42 to facilitate subsequent connection of the drain electrode 42 to a pixel electrode.

Figure 7:
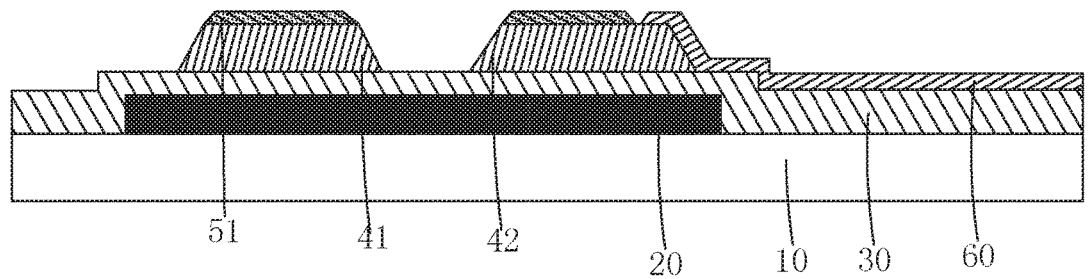
FIG. 7 is a schematic view illustrating Step S3 of the manufacturing method of the array substrate according to the present invention.

Step S3: as shown in FIG. 7, depositing a transparent conductive film on the backing plate 10 that has undergone Step S2 and subjecting the transparent conductive film to patterning to form a pixel electrode 60, wherein the pixel electrode 60 is located on the drain electrode 42 and the isolation layer 30 to be connected with a portion of the drain electrode 42 that is exposed outside the ohmic contact layer 51.

Specifically, the transparent conductive film is made by physical vapor deposition; and the transparent conductive film is formed of a material comprising indium tin oxide (ITO).

Figure 8:
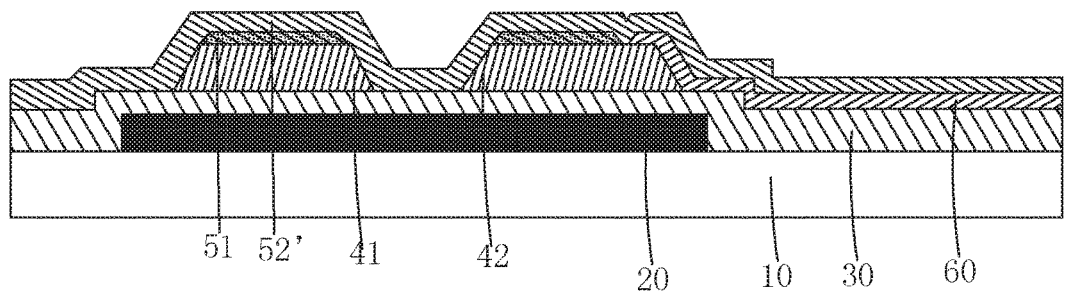
FIGS. 8-9 are schematic views illustrating Step S4 of the manufacturing method of the array substrate according to the present invention.
Figure 9:
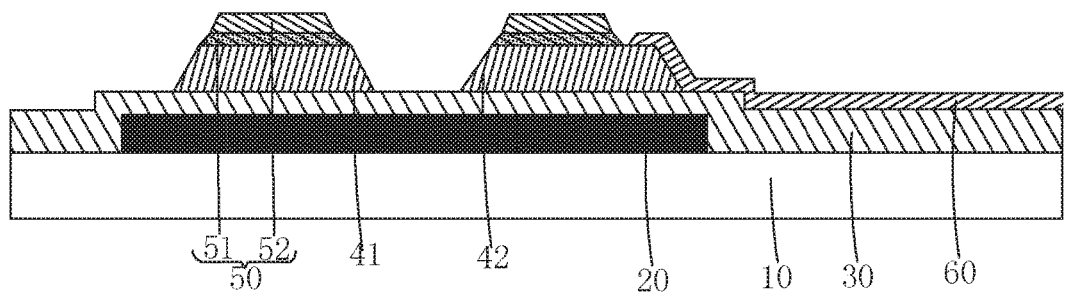

Step S4: as shown in FIGS. 8-9, depositing an amorphous silicon layer 52' on the backing plate 10 that has undergone Step S3 and subjecting the amorphous silicon layer 52' to patterning to form a semiconductor layer 52, wherein the semiconductor layer 52 is located on the ohmic contact layers 51 and the isolation layer 30 and constitutes, in combination with the ohmic contact layers 51, an active layer 50.

Specifically, the ion-doped amorphous silicon layer 51' formed in Step S2 and the amorphous silicon layer 52' formed in Step S4 are both made by chemical vapor deposition.

Specifically, a difference between manufacturing operations of the ion-doped amorphous silicon layer 51' and the amorphous silicon layer 52' is that borane gas is introduced in the chemical vapor deposition process in which the ion-doped amorphous silicon layer 51' is being deposited, wherein the borane gas used is specifically boroethane gas, and the ohmic contact layers 51 are N-type ohmic contact layers.

Figure 10:
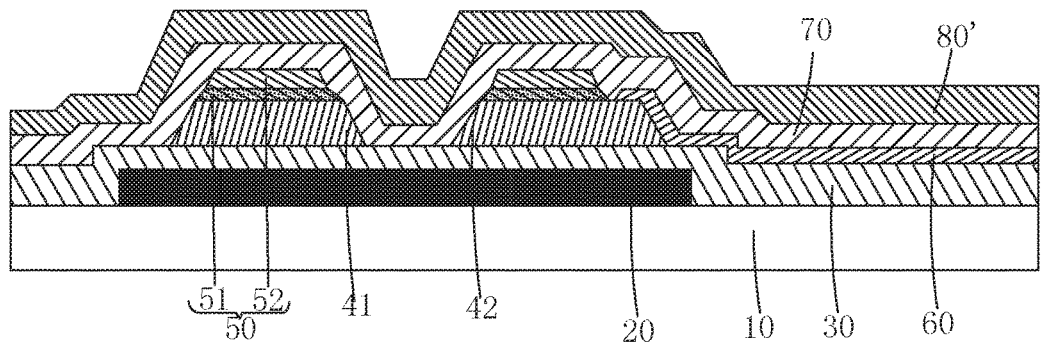
FIGS. 10-11 are schematic views illustrating Step S5 of the manufacturing method of the array substrate according to the present invention.
Figure 11:
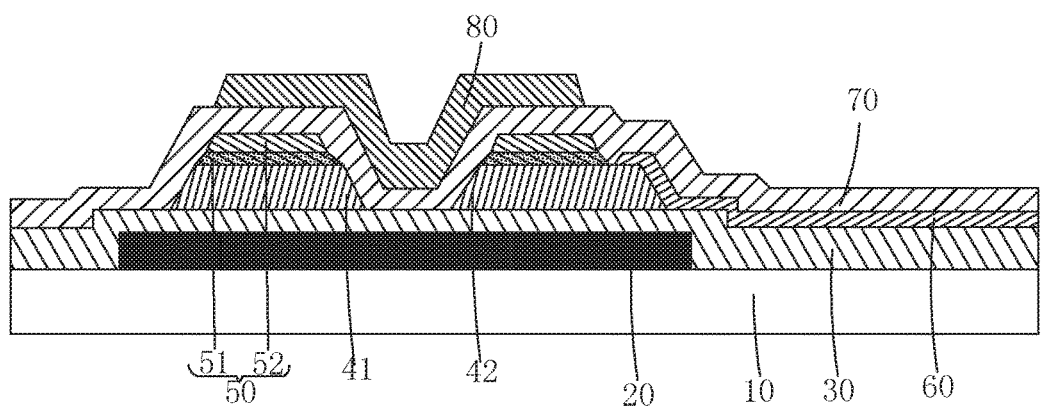

Step S5: as shown in FIGS. 10-11, sequentially depositing a gate insulation layer 70 and a first metal layer 80' on the backing plate 10 that has undergone Step S4 and subjecting the first metal layer 80' to patterning to form a gate electrode 80 located above and corresponding to the active layer 50.

Specifically, the gate insulation layer 70 is made by chemical vapor deposition.

Specifically, the gate insulation layer 70 comprises a silicon nitride layer, a silicon oxide layer, or a stacked combination of a silicon nitride layer and a silicon oxygen layer.

Specifically, the first metal layer 80' is made by physical vapor deposition; and the first metal layer 80' is formed of a material comprising one or multiple ones of molybdenum, aluminum, copper, and titanium.

Figure 12:
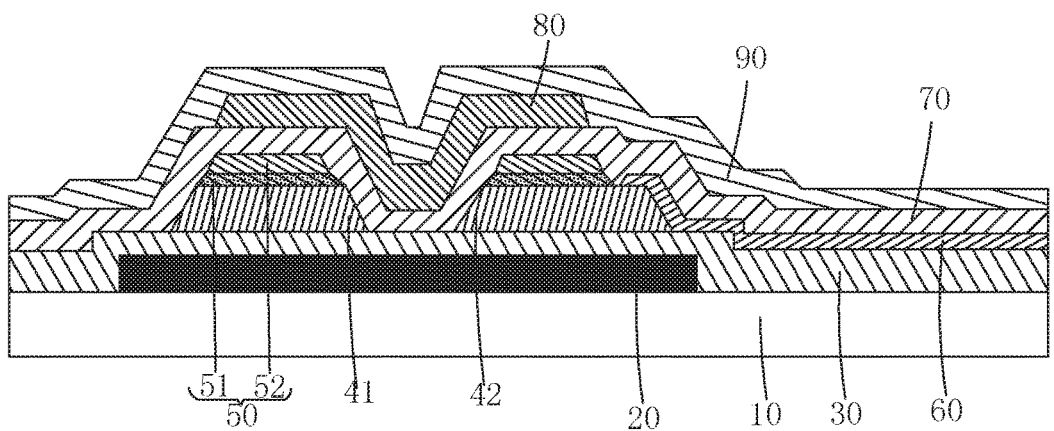
FIG. 12 is a schematic view illustrating Step S6 of the manufacturing method of the array substrate according to the present invention.

Step S6: as shown in FIG. 12, depositing a passivation layer 90 on the gate insulation layer 70 and the gate electrode 80.

Specifically, the passivation layer 90 is made by chemical vapor deposition; and the passivation layer 90 comprises a silicon nitride layer, a silicon oxide layer, or a stacked combination of a silicon nitride layer and a silicon oxygen layer.

Figure 13:
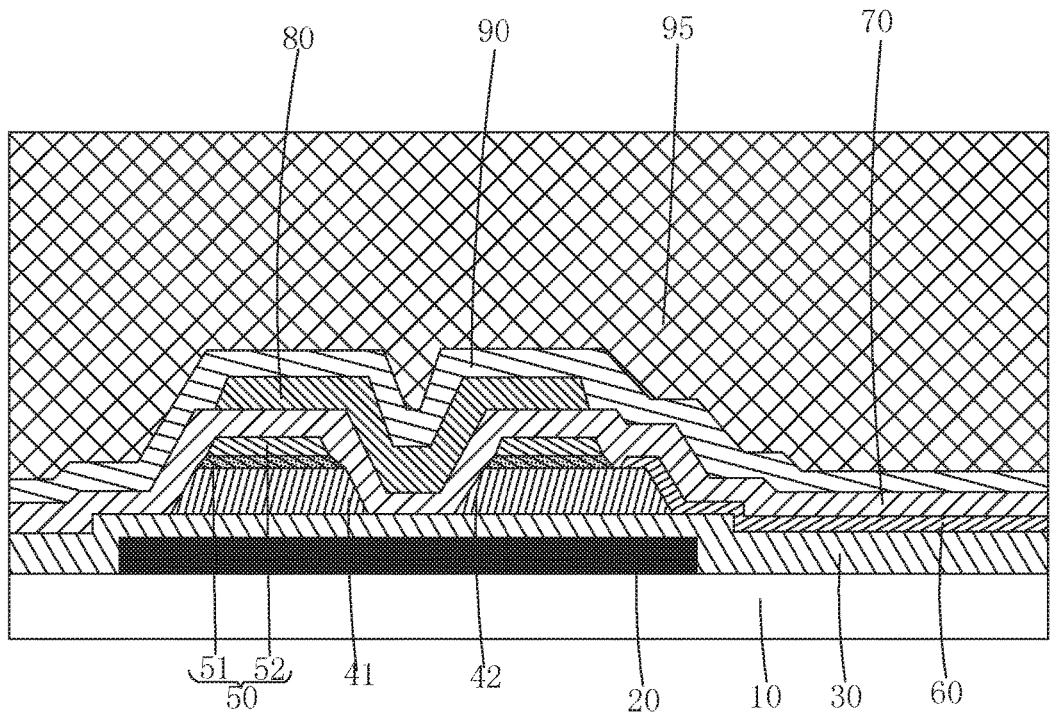
FIG. 13 is a schematic view illustrating Step S7 of the manufacturing method of the array substrate according to the present invention and is also a schematic view illustrating a structure of an array substrate according to the present invention.

Step S7: as shown in FIG. 13, forming a color filter film layer 95 on the passivation layer 90.

Specifically, the color filter film layer 95 comprises a red resist unit, a green resist unit, and a blue resist unit, and the color filter film layer 95 is formed though operations of coating, exposure, and development of photoresist.

The present invention provides a manufacturing method of an array substrate, wherein a pixel electrode 60 is directly formed on a drain electrode 42 and connected with the drain electrode 42 so that connection can be achieved without the need to form a via in insulation layers, such as a gate insulation layer 70. This also saves an opening formed in a color filter layer 95 so as to effectively reduce occurrence of bubbles formed in a COA array substrate. Further, a black matrix 20 may function as a light shielding layer to prevent irradiation of light from a backlight module of a display panel on an active layer 50 to thereby improve stability of a device. Further, the color filter layer 95 that is located on the topmost layer may provide planarization of an entire surface of the array substrate to facilitate control of cell gap of the display panel and prevent occurrence of random orientation of liquid crystal thereby helping improve quality of a display panel. Further, an ohmic contact layer 51 that constitutes the active layer 50 is formed through patterning with the same mask as that of the source electrode 41 and the drain electrode 42, while a semiconductor layer 52 is formed through patterning with another mask so that there is no need to use a high-end mask to make a channel zone of the active layer 50 so as to allow the manufacturing of the active layer 50 to be done with a regular mask based operation, achieving effects of shortening of production cycle and reducing costs. Further, there is also no concern about thickening the semiconductor layer 52 due to applying etching to form the channel zone so that a thinned semiconductor layer 52 can be made thereby improving electrical performance of a TFT device.

Based on the above-described manufacturing method of an array substrate, with reference to FIG. 13, the present invention also provides an array substrate, which comprises a backing plate 10, a black matrix 20 arranged on the backing plate 10, an isolation layer 30 arranged on the black matrix 20 and the backing plate 10, a source electrode 41 and a drain electrode 42 arranged on the isolation layer 30 and spaced from each other, ohmic contact layers 51 arranged on the source electrode 41 and the drain electrode 42, a pixel electrode 60 arranged on the drain electrode 42 and the isolation layer 30, a semiconductor layer 52 arranged on the ohmic contact layers 51 and the isolation layer 30, a gate insulation layer 70 arranged on the pixel electrode 60, the semiconductor layer 52, and the isolation layer 30, a gate electrode 80 arranged on the gate insulation layer 70, a passivation layer 90 arranged on the gate insulation layer 70 and the gate electrode 80, and a color filter film layer 95 arranged on the passivation layer 90.

In the array substrate, the ohmic contact layers 51 have sizes that are smaller than sizes of the source electrode 41 and the drain electrode 42 so as to expose a portion of an upper surface of the drain electrode 42; the pixel electrode 60 is connected to a portion of the ohmic contact layer 51 exposed outside the drain electrode 42; the semiconductor layer 52 and the ohmic contact layers 51 are formed of an amorphous silicon material layer and an ion-doped amorphous silicon material layer, respectively, and the semiconductor layer 52 and the ohmic contact layers 51 collectively form an active layer 50.

Specifically, the ohmic contact layers 51 and the source electrode and the drain electrode 41, 42 are formed through patterning conducted with one mask, wherein the ohmic contact layers 51 are formed through dry etching, while the source electrode 41 and the drain electrode 42 are formed through wet etching.

Specifically, the ohmic contact layers 51 and the semiconductor layer 52 are both made by chemical vapor deposition; and a difference of manufacturing operations of the ohmic contact layers 51 and the semiconductor layer 52 is that borane gas is introduced in the chemical vapor deposition process in which the ohmic contact layers 51 are made and is specifically boroethane gas.

Specifically, the isolation layer 30, the gate insulation layer 70, and the passivation layer 90 are all made by chemical vapor deposition; the isolation layer 30, the gate insulation layer 70, and the passivation layer 90 are each a silicon nitride layer, a silicon oxide layer, or a stacked combination of a silicon nitride layer and a silicon oxygen layer.

Specifically, the source electrode 41, the drain electrode 42, and the gate electrode 80 are all made by physical vapor deposition; the source electrode 41, the drain electrode 42, and the gate electrode 80 are each formed of a material comprising one or multiple ones of molybdenum, aluminum, copper, and titanium.

Specifically, the pixel electrode 60 is mad by physical vapor deposition; and the pixel electrode 60 is formed of a material comprising indium tin oxide.

In summary, the present invention provides a manufacturing method of an array substrate, which first forms a black matrix on a backing plate, followed by making a top-gate TFT device on the black matrix, and finally making a color filter layer on the TFT device, wherein the pixel electrode is directly arranged on a drain electrode and connected with the drain electrode so that connection can be achieved without the need to form a via in insulation layers. This also saves an opening formed in a color filter layer so as to effectively reduce occurrence of bubbles formed in a COA array substrate. Further, a black matrix may function as a light shielding layer to prevent irradiation of light from a backlight module of a display panel on an active layer to thereby improve stability of a device. Further, the color filter layer that is located on the topmost layer may provide planarization of an entire surface of the array substrate to facilitate control of cell gap of the display panel and prevent occurrence of random orientation of liquid crystal thereby helping improve quality of a display panel. Further, an ohmic contact layer that constitutes the active layer is formed through patterning with the same mask as that of the source electrode and the drain electrode, while a semiconductor layer is formed through patterning with another mask so that there is no need to use a high-end mask to make a channel zone of the active layer so as to allow the manufacturing of the active layer to be done with a regular mask based operation, achieving effects of shortening of production cycle and reducing costs. Further, there is also no concern about thickening the semiconductor layer due to applying etching to form the channel zone so that a thinned semiconductor layer can be made thereby improving electrical performance of a TFT device. The present invention provides an array substrate, which requires a simple manufacturing method, provides enhanced electrical performance of a TFT device and stability of performance, and improves quality of a display panel.

Based on the description given above, those having ordinary skills in the art may easily contemplate various changes and modifications according to the technical solution and the technical ideas of the present invention. All these changes and modifications are considered belonging to the protection scope of the present invention as defined in the appended claims.

What is claimed is:

1. A manufacturing method of an array substrate, comprising the following steps:

Step S1: providing a backing plate, coating a layer of a black resist material on the backing plate, followed by exposure and development to form a black matrix; and then, forming an isolation layer on the black matrix and the backing plate through deposition;

Step S2: sequentially depositing a second metal layer and an ion-doped amorphous silicon layer on the isolation layer, subjecting the second metal layer and the ion-doped amorphous silicon layer to patterning, so as to form spaced source electrode and drain electrode from the second metal layer and form ohmic contact layers that are respectively located on the source electrode and the drain electrode from the ion-doped amorphous silicon layer, wherein the ohmic contact layers have sizes that are smaller than sizes of the source electrode and the drain electrode so as to expose a portion of an upper surface of the drain electrode;

Step S3: depositing a transparent conductive film on the backing plate obtained in Step S2 and subjecting the transparent conductive film to patterning to form a pixel electrode, wherein the pixel electrode is located on the drain electrode and the isolation layer to be connected with a portion of the drain electrode that is exposed outside the ohmic contact layer;

Step S4: depositing an amorphous silicon layer on the backing plate obtained in Step S3 and subjecting the amorphous silicon layer to patterning to form a semiconductor layer, wherein the semiconductor layer is located on the ohmic contact layers and the isolation layer and constitutes, in combination with the ohmic contact layers, an active layer;

Step S5: sequentially depositing a gate insulation layer and a first metal layer on the backing plate obtained in Step S4 and subjecting the first metal layer to patterning to form a gate electrode located above and corresponding to the active layer;

Step S6: depositing a passivation layer on the gate insulation layer and the gate electrode; and Step S7: forming a color filter film layer on the passivation layer.

2. The manufacturing method of the array substrate as claimed in claim 1, wherein in Step S2, patterning of the second metal layer and the ion-doped amorphous silicon layer is conducted with one mask and comprises the following process: coating a photoresist material on the ion-doped amorphous silicon layer, using the mask to subject the photoresist material to exposure and development to form a photoresist layer, using the photoresist layer as a shielding layer to first subject the ion-doped amorphous silicon layer to dry etching to form the ohmic contact layers, and then, subject the second metal layer to wet etching to form the source electrode and the drain electrode.

3. The manufacturing method of the array substrate as claimed in claim 1, wherein the ion-doped amorphous silicon layer and the amorphous silicon layer are made by chemical vapor deposition; and a difference of manufacturing operations of the ion-doped amorphous silicon layer and the amorphous silicon layer is that borane gas is introduced in the chemical vapor deposition in which the ion-doped amorphous silicon layer is deposited.

4. The manufacturing method of the array substrate as claimed in claim 1, wherein the isolation layer, the gate insulation layer, and the passivation layer are made by chemical vapor deposition; and the isolation layer, the gate insulation layer, and the passivation layer are each a silicon nitride layer, a silicon oxide layer, or a stacked combination of a silicon nitride layer and a silicon oxygen layer.

5. The manufacturing method of the array substrate as claimed in claim 1, wherein the second metal layer and the first metal layer are made by physical vapor deposition; and the second metal layer and the first metal layer are each formed of a material comprising one or multiple ones of molybdenum, aluminum, copper, and titanium.

6. An array substrate, comprising a backing plate, a black matrix arranged on the backing plate, an isolation layer arranged on the black matrix and the backing plate, a source electrode and a drain electrode arranged on the isolation layer and spaced from each other, ohmic contact layers arranged on the source electrode and the drain electrode, a pixel electrode arranged on the drain electrode and the isolation layer, a semiconductor layer arranged on the ohmic contact layers and the isolation layer, a gate insulation layer arranged on the pixel electrode, the semiconductor layer, and the isolation layer, a gate electrode arranged on the gate insulation layer, a passivation layer arranged on the gate insulation layer and the gate electrode, and a color filter film layer arranged on the passivation layer;

wherein the ohmic contact layers have sizes that are smaller than sizes of the source electrode and the drain electrode so as to expose a portion of an upper surface of the drain electrode; the pixel electrode is connected to a portion of the ohmic contact layer exposed outside the drain electrode; the semiconductor layer and the ohmic contact layers are formed of an amorphous silicon material layer and an ion-doped amorphous silicon material layer, respectively, and the semiconductor layer and the ohmic contact layers collectively form an active layer.

7. The array substrate as claimed in claim 6, wherein the ohmic contact layers and the source and drain electrodes are formed through patterning conducted with one mask, wherein the ohmic contact layers are formed through dry etching, and the source electrode and the drain electrode are formed through wet etching.

8. The array substrate as claimed in claim 6, wherein the ohmic contact layers and the semiconductor layer are made by chemical vapor deposition; and a difference of manufacturing operations of the ohmic contact layers and the semiconductor layer is that borane gas is introduced in the chemical vapor deposition process in which the ohmic contact layers are made.

9. The array substrate as claimed in claim 6, wherein the isolation layer, the gate insulation layer, and the passivation layer are made by chemical vapor deposition; and the isolation layer, the gate insulation layer, and the passivation layer are each a silicon nitride layer, a silicon oxide layer, or a stacked combination of a silicon nitride layer and a silicon oxygen layer.

10. The array substrate as claimed in claim 6, wherein the source electrode, the drain electrode, and the gate electrode are made by physical vapor deposition; and the source electrode, the drain electrode, and the gate electrode are each formed of a material comprising one or multiple ones of molybdenum, aluminum, copper, and titanium.

11. An array substrate, comprising a backing plate, a black matrix arranged on the backing plate, an isolation layer arranged on the black matrix and the backing plate, a source electrode and a drain electrode arranged on the isolation layer and spaced from each other, ohmic contact layers arranged on the source electrode and the drain electrode, a pixel electrode arranged on the drain electrode and the isolation layer, a semiconductor layer arranged on the ohmic contact layer and the isolation layer, a gate insulation layer arranged on the pixel electrode, the semiconductor layer, and the isolation layer, a gate electrode arranged on the gate insulation layer, a passivation layer arranged on the gate insulation layer and the gate electrode, and a color filter film layer arranged on the passivation layer;

wherein the ohmic contact layers have sizes that are smaller than sizes of the source electrode and the drain electrode so as to expose a portion of an upper surface of the drain electrode; the pixel electrode is connected to a portion of the ohmic contact layer exposed outside the drain electrode; the semiconductor layer and the ohmic contact layers are formed of an amorphous silicon material layer and an ion-doped amorphous silicon material layer, respectively, and the semiconductor layer and the ohmic contact layers collectively form an active layer;

wherein the isolation layer, the gate insulation layer, and the passivation layer are made by chemical vapor deposition; and the isolation layer, the gate insulation layer, and the passivation layer are each a silicon nitride layer, a silicon oxide layer, or a stacked combination of a silicon nitride layer and a silicon oxygen layer; and wherein the source electrode, the drain electrode, and the gate electrode are made by physical vapor deposition; and the source electrode, the drain electrode, and the gate electrode are each formed of a material comprising one or multiple ones of molybdenum, aluminum, copper, and titanium.

12. The array substrate as claimed in claim 11, wherein the ohmic contact layers and the source and drain electrodes are formed through patterning conducted with one mask, wherein the ohmic contact layers are formed through dry etching, and the source electrode and the drain electrode are formed through wet etching.

13. The array substrate as claimed in claim 11, wherein the ohmic contact layers and the semiconductor layer are made by chemical vapor deposition; and a difference of manufacturing operations of the ohmic contact layers and the semiconductor layer is that borane gas is introduced in the chemical vapor deposition process in which the ohmic contact layer is made.

* * * * *